United States Patent
Lee et al.

(10) Patent No.: US 11,598,793 B2
(45) Date of Patent: Mar. 7, 2023

(54) CURRENT SENSOR CAPABLE OF AUTOMATIC ADJUSTMENT OF OFFSET VOLTAGE

(71) Applicants: SKAICHIPS CO., LTD, Suwon-si (KR); RESEARCH & BUSINESS FOUNDATION SUNGKYUNKWAN UNIVERSITY, Suwon-si (KR)

(72) Inventors: Kang Yoon Lee, Seoul (KR); Byeong Gi Jang, Suwon-si (KR); Jong Wan Jo, Suwon-si (KR); Min Young Kim, Suwon-si (KR); Dong Soo Park, Suwon-si (KR); Kyung Duk Choi, Suwon-si (KR); Young Gun Pu, Suwon-si (KR)

(73) Assignees: SKAICHIPS CO., LTD., Suwon-si (KR); Research & Business Foundation Sungkyunkwan University, Suwon-si (KR)

(*) Notice: Subject to any disclaimer, the term of this patent is extended or adjusted under 35 U.S.C. 154(b) by 45 days.

(21) Appl. No.: 17/469,033

(22) Filed: Sep. 8, 2021

(65) Prior Publication Data
US 2022/0074974 A1 Mar. 10, 2022

(30) Foreign Application Priority Data
Sep. 8, 2020 (KR) .................. 10-2020-0114337

(51) Int. Cl.
*G01R 19/00* (2006.01)
*H03F 3/04* (2006.01)

(52) U.S. Cl.
CPC .......... *G01R 19/0092* (2013.01); *H03F 3/04* (2013.01); *H03F 2200/375* (2013.01)

(58) Field of Classification Search
CPC .......... G01R 19/0092; G01R 19/16542; G01R 19/16566; H03F 3/04; H03F 3/45968; H03F 3/45475
See application file for complete search history.

(56) References Cited

U.S. PATENT DOCUMENTS 8,072,200 B1* 12/2011 Qiu ............ H02M 3/1584
323/907
2012/0025735 A1* 2/2012 Wang .......... H05B 45/382
363/21.16
(Continued)

FOREIGN PATENT DOCUMENTS

JP  7-38345 A  2/1995
KR 10-1672894 B1 11/2016

OTHER PUBLICATIONS

Korean Office Action dated Jun. 20, 2022, in counterpart Korean Patent Application No. 10-2020-0114337 (5 pages in Korean).

*Primary Examiner* — Dominic E Hawkins
(74) *Attorney, Agent, or Firm* — NSIP Law

(57) ABSTRACT

A current sensor automatically adjusting an offset voltage, includes an input corrector, upon receiving a first voltage, a second voltage, and a control signal, configured to correct either one or both of the first voltage and the second voltage to reduce an absolute value of a difference between the first voltage and the second voltage based on the control signal, and output a correction result; an input amplifier configured to amplify a voltage output from the input corrector; an output amplifier configured to generate an output voltage when a voltage amplified by the input amplifier is input; a controller including a switch connected to one of voltages amplified by the input amplifier to be grounded when a difference between the first voltage and the second voltage (Continued)

is larger than a first threshold value; and a correction circuit controller configured to generate the control signal to input to the input corrector.

12 Claims, 5 Drawing Sheets

(56) References Cited

U.S. PATENT DOCUMENTS

| | | | | |
|---|---|---|---|---|
| 2012/0324999 A1* | 12/2012 | Ragot | ................ | H03M 1/1038 |
| | | | | 73/504.12 |
| 2020/0212858 A1* | 7/2020 | Onishi | ................ | H03F 3/3018 |
| 2021/0278444 A1* | 9/2021 | Taguchi | ............ | G01R 19/0092 |

* cited by examiner

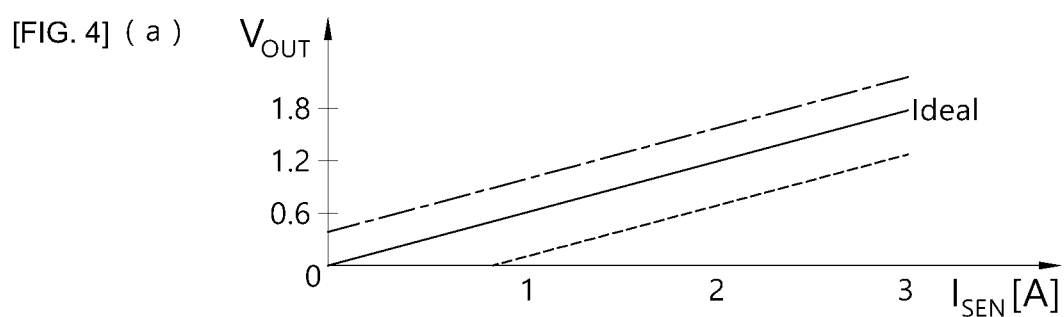
[FIG. 4] (a)
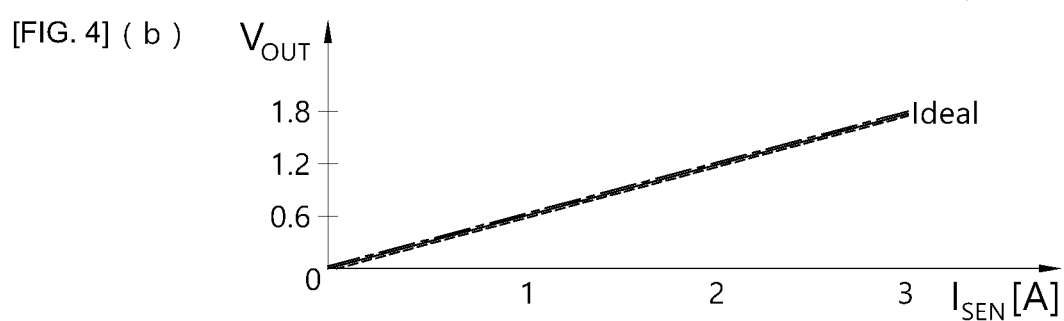
[FIG. 4] (b)

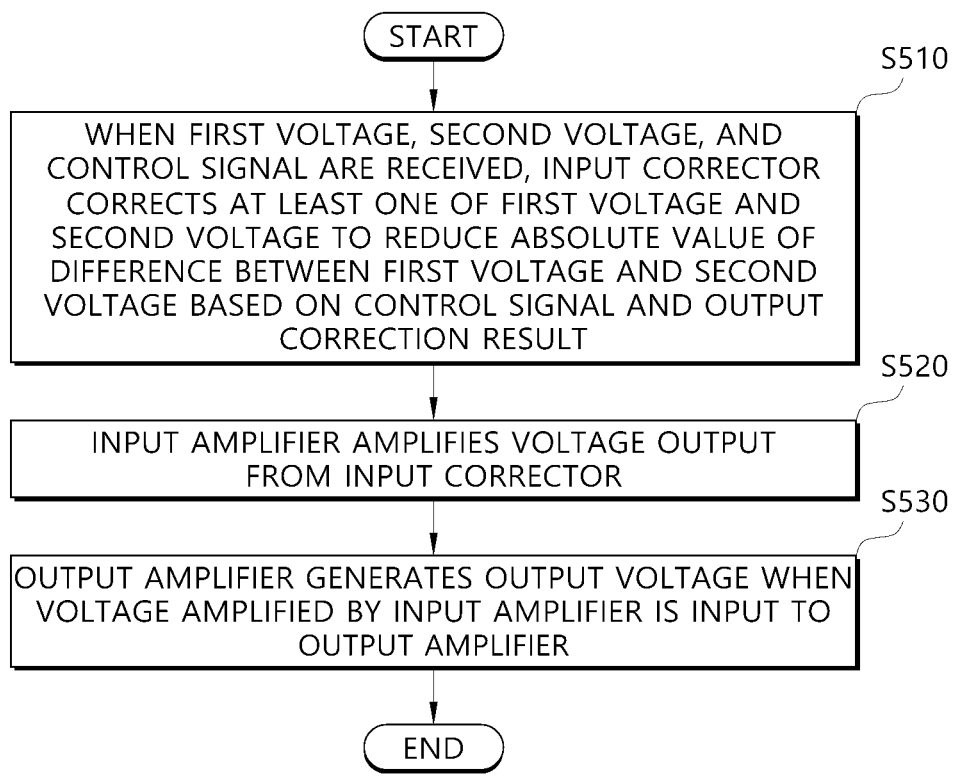
[FIG. 5]

CURRENT SENSOR CAPABLE OF AUTOMATIC ADJUSTMENT OF OFFSET VOLTAGE

CROSS-REFERENCE TO RELATED APPLICATIONS

This application claims the benefit under 35 USC 119(a) of Korean Patent Application No. 10-2020-0114337 filed on Sep. 8, 2020, in the Korean Intellectual Property Office, the entire disclosure of which is incorporated herein by reference for all purposes.

BACKGROUND

1. Field

The present disclosure relates to a current sensor which automatically adjusts an offset voltage and a method for automatically adjusting an offset voltage of a current sensor.

2. Description of Related Art

Generally, a power supply system of a battery pack including such a secondary battery includes a current sensor for measuring a current. The current sensor measures a current flowing through a charging/discharging path of the battery pack to monitor the state of the battery pack and detect an overcurrent flowing through the battery pack. Further, the current measured by the current sensor may be utilized as information for calculating an SOC or utilized as a base for determining whether the charging/discharging process is normally performed.

However, the current sensor of the related art compensates in the form of a close loop of an output amplifier and it is difficult to accurately compensate when an offset in the input voltage is generated.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a current sensor configured to automatically adjust an offset voltage, includes an input corrector, an input amplifier, an output amplifier, and a controller. The input corrector, upon receiving a first voltage, a second voltage, and a control signal, is configured to correct either one or both of the first voltage and the second voltage to reduce an absolute value of a difference between the first voltage and the second voltage based on the control signal, and output a correction result. The input amplifier is configured to amplify a voltage output from the input corrector. The output amplifier is configured to generate an output voltage when a voltage amplified by the input amplifier is input. The controller includes a switch connected to one of voltages amplified by the input amplifier to be grounded when a difference between the first voltage and the second voltage is larger than a first threshold value, and a correction circuit controller configured to generate the control signal to input to the input corrector.

The switch may be grounded while a first signal is applied.

The switch may be closed when a second signal is applied.

A current sensing value may be determined based on the output voltage acquired after the switch is closed.

When the control signal is consecutively changed, the second signal may be applied.

The control signal may be determined based on a sign of the difference between the first voltage and the second voltage.

In another general aspect, a method of automatically adjusting an offset of a current sensor, includes receiving a first voltage, a second voltage, and a control signal; adjusting, using an input corrector, either one or both of the first voltage and the second voltage to reduce an absolute value of a difference between the first voltage and the second voltage based on the control signal, and outputting a correction result; amplifying, using an input amplifier, a voltage output from the input corrector; and generating, using output amplifier, an output voltage when the voltage amplified by the input amplifier is input to the output amplifier. When a difference between the first voltage and the second voltage is larger than a first threshold value, a switch is grounded and the control signal is generated by a correction circuit controller to be input to the input corrector.

The method may further include grounding the switch when a first signal is applied.

The method may further include closing the switch when a second signal is applied.

The method may further include determining a current sensing value based on the output voltage acquired after the switch is closed.

When the control signal is consecutively changed, the second signal may be applied.

The control signal may be determined based on a sign of the difference between the first voltage and the second voltage.

Other features and aspects will be apparent from the following detailed description, the drawings, and the claims.

BRIEF DESCRIPTION OF DRAWINGS

FIG. 4A is a view depicting a change in an output voltage of a current sensor according to an embodiment of the present disclosure.

FIG. 4B is a view depicting a change in an output voltage of a current sensor according to an embodiment of the present disclosure.

FIG. 5 is a flowchart of a method of automatically adjusting an offset voltage of a current sensor according to an embodiment of the present disclosure.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
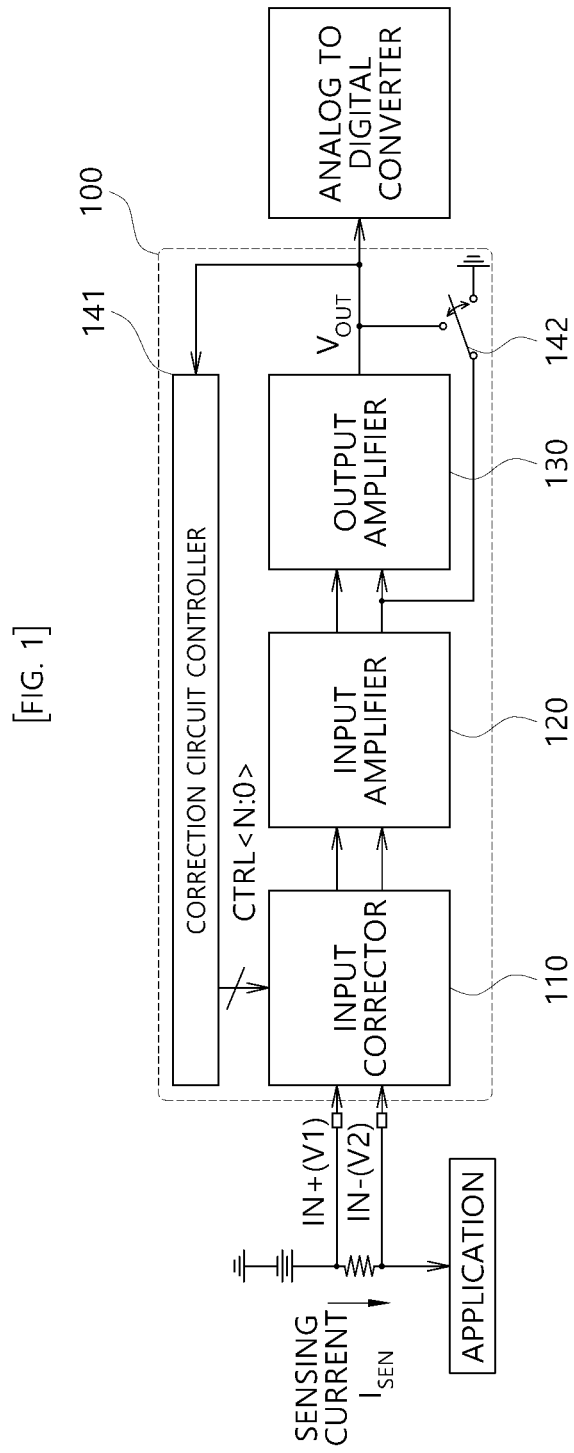
FIG. 1 is a view depicting a current sensor that automatically adjusts an offset voltage according to an embodiment of the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

If it is not contrarily defined, all terms used herein, including technological or scientific terms, have the same meaning as those generally understood by a person with ordinary skill in the art. Terms that are defined in a generally used dictionary should be interpreted to have the same meaning as the meaning in the context of the related art but are not interpreted as an ideally or excessively formal meaning if it is not clearly defined in the present disclosure.

An object of the present disclosure is to provide a current sensor which reduces an influence of an offset by automatically adjusting a voltage offset generated in elements and circuits used in the current sensor and creates an accurate output voltage, and a method thereof.

FIG. 1 is a view depicting a current sensor that automatically adjusts an offset voltage according to an embodiment of the present disclosure.

Referring to FIG. 1, the current sensor 100 according to the embodiment of the present disclosure may include an input corrector 110, an input amplifier 120, an output amplifier 130, a correction circuit controller 141, and a switch 142. Further, the correction circuit controller 141 and the switch 142 may be components of a controller (not illustrated). Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

To sense an input current $I_{SEN}$, a first voltage (referred to as IN+ or V1) or a second voltage (referred to as IN− or V2) may be input to the input corrector 110 of the current sensor 100. At this time, a current sensor, according to the related art, has a close loop structure of an output terminal so that an offset may be generated in the output voltage due to a voltage offset generated in the input amplifier or the output amplifier and mismatch of the resistor element, and the noise. When the offset is generated in the output voltage, the sensing accuracy of the current sensor may deteriorate.

Accordingly, to prevent the offset from being generated in the output voltage $V_{OUT}$, the current sensor 100, according to the embodiment of the present disclosure, changes the close loop structure of the output terminal into an open-loop structure to adjust an input voltage to have a small magnitude. In this case, by making two input voltages of the input amplifier 120 equal to each other and making the open-loop output voltage $V_{OUT}$ 0[V], the voltage offset generated in the current sensor 100 may be canceled.

Specifically, after disconnecting the close loop by grounding the switch 142 included in the current sensor 100 of FIG. 1 to have an open-loop state, the input voltage is changed to satisfy Equation 1 using a characteristic that the open-loop voltage gain is high to generate an output voltage $V_{OUT}$ which is not affected by the offset generated in the current sensor 100.

[Equation 1]

$$V1 - V2 = 0 = VCM \quad (1)$$

$$IN+ = V1 \quad (2)$$

$$IN- = V2 \quad (3)$$

$$IN- = IN+ \quad (4)$$

In other words, the current sensor 100, according to the embodiment of the present disclosure, operates to make an error generated in the output voltage $V_{OUT}$ caused by the inside or outside noise IN+−IN−=0 in an open-loop state. Therefore, the error generated in the output voltage $V_{OUT}$ may be reduced to the minimum without using a different technique.

Figure 2:
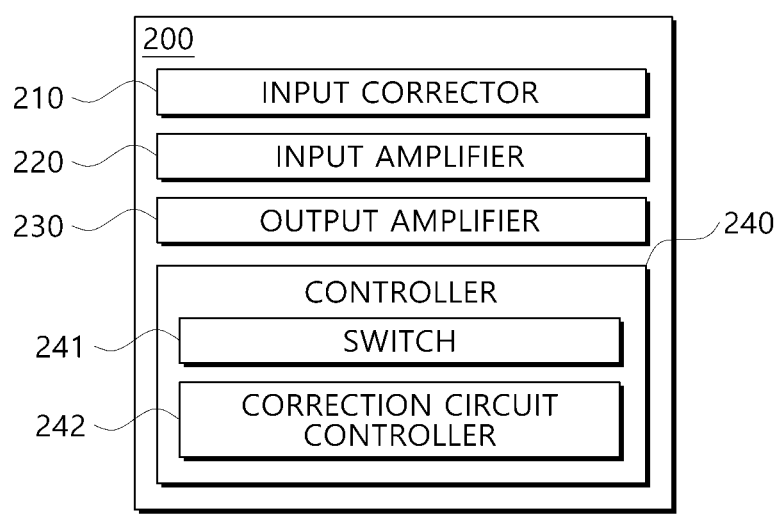
FIG. 2 is a block diagram depicting a current sensor that automatically adjusts an offset voltage according to another embodiment of the present disclosure.

FIG. 2 is a block diagram depicting a current sensor that automatically adjusts an offset voltage according to another embodiment of the present disclosure.

A current sensor 200, according to an embodiment of the present disclosure, which automatically adjusts an offset voltage, may include an input corrector 210, an input amplifier 220, an output amplifier 230, and a controller 240. In the meantime, it is obvious to those skilled in the art that the current sensor 200 may further include other components and the components illustrated in FIG. 2.

When the input corrector 210 receives a first voltage, a second voltage, and a control signal, in order to reduce an absolute value of a difference between the first voltage and the second voltage based on the control signal, the input corrector 210 corrects at least one of the first voltage and the second voltage and may output a correction result.

The input amplifier 220 may amplify a voltage output from the input corrector 210.

The output amplifier 230 may generate an output voltage when a voltage amplified by the input amplifier 220 is input.

The controller 240 may include a switch 241 and a correction circuit controller 242. Here, the switch 241 is connected to one of the voltages amplified by the input amplifier 220 to be grounded if a difference between the first voltage and the second voltage is larger than a first threshold value. Further, the correction circuit controller 242 generates a control signal to reduce the difference between the first voltage and the second voltage to input the control signal to the input corrector 210. Here, the control signal may be an OFFCON signal illustrated in FIG. 3.

In the meantime, the switch 241 may be grounded while the first signal is applied. According to an embodiment, the first signal may be a Cal_PEN signal illustrated in FIG. 3. Further, the switch 241 may be closed when the second signal is applied. Here, the second signal may be a CAL_DONE signal illustrated in FIG. 3.

In the meantime, a current sensing value (is also referred to as an input current, $I_{SEN}$) may be determined based on an output voltage $V_{OUT}$ acquired after the switch 241 is closed.

Further, the control signal may be determined based on a sign of the difference between the first voltage and the second voltage. Further, when the control signal is changed consecutively two times, the second signal may be applied.

Figure 3:
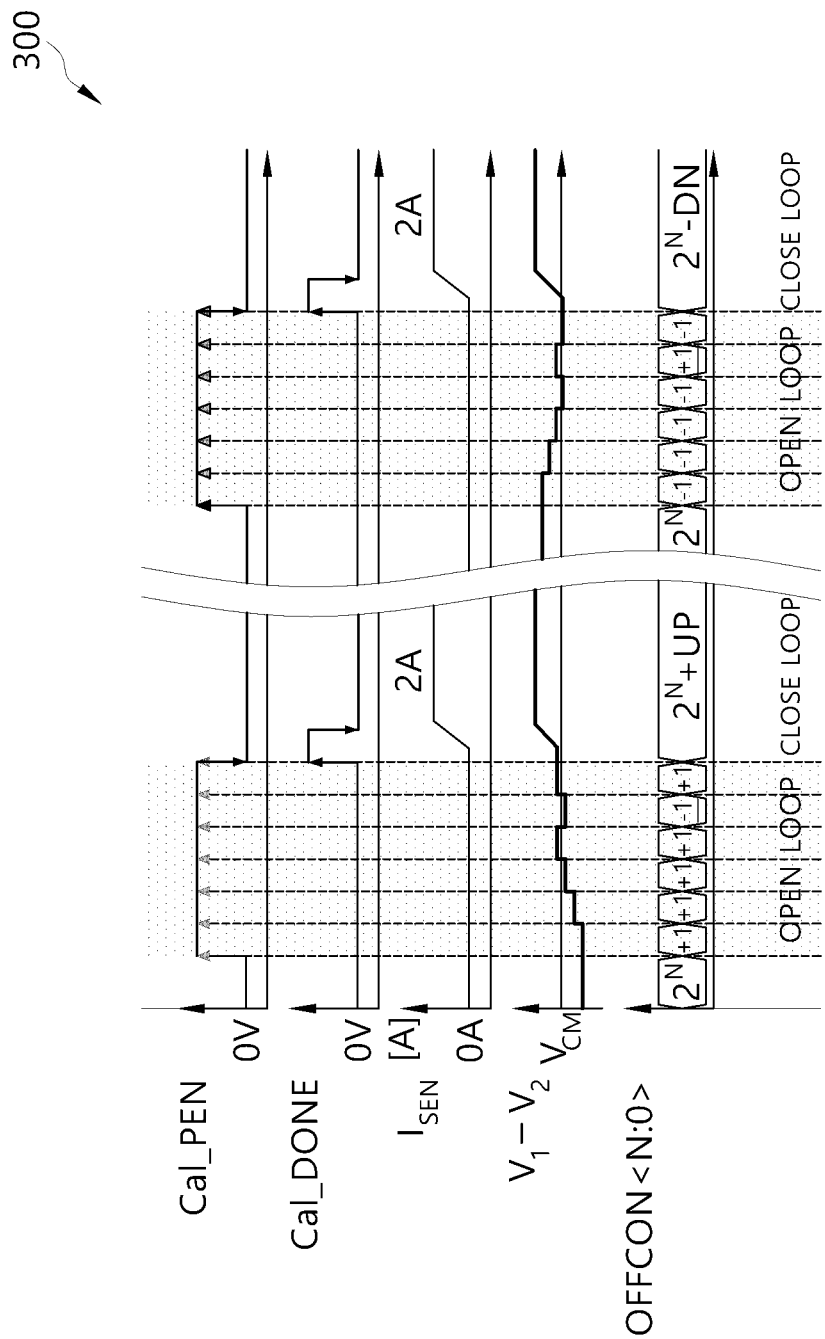
FIG. 3 is a view depicting an operation method of a current sensor according to an embodiment of the present disclosure.

FIG. 3 is a view depicting an operation method of a current sensor according to an embodiment of the present disclosure.

FIG. 3 illustrates a timing gram of a current sensor according to an embodiment of the present disclosure.

Specifically, the timing gram of FIG. 3 illustrates a calibration process of changing a current sensor from a close loop to an open-loop and changing a first voltage V1. In the meantime, the correction circuit controller may generate a Cal_PEN signal, a CAL_DONE signal, and an OFFCON signal of FIG. 3 and control the switch. Further, the OFFCON signal may be output to the input corrector.

$V_{CM}$, an indicator representing a difference between the first voltage V1 and the second voltage V2, may affect the output voltage $V_{OUT}$. Accordingly, when the output voltage $V_{OUT}$ has a predetermined error level, a value of the Cal_PEN signal is changed to a high value so that the current sensor is changed from the close loop to the open loop.

In the meantime, when the first voltage V1 is lower than the second voltage V2, the correction circuit controller increases an OFFCON signal which is a signal input to the input amplifier, and then transmits the OFFCON signal to the input amplifier to make the first voltage and the second voltage equal to each other.

If the first voltage V1 is higher than the second voltage V2, the correction circuit controller reduces the OFFCON signal and then may output the OFFCON signal to the input corrector. At this time, when the correction circuit controller detects the state change of the output voltage $V_{OUT}$ and fixes the OFFCON signal, which is a changing state, the Cal_PEN signal is synchronized with the CAL_DONE signal to be low to finish the calibration operation.

FIGS. 4A and 4B are views depicting a change in an output voltage of a current sensor according to an embodiment of the present disclosure.

FIGS. 4A and 4B are graphs depicting that when the correction circuit controller used for the current sensor, according to the embodiment of the present disclosure, is used, an output voltage $V_{OUT}$ is compensated.

Referring to FIG. 4A, when the correction circuit controller does not operate, a value of the output voltage $V_{OUT}$ before being compensated is shifted to a y-axis as compared with an ideal value, due to the mismatch of an internal passive element or an error of the input amplifier or the output amplifier, to have a large error.

In contrast, referring to FIG. 4B, after the correction circuit controller operates, the correction circuit controller generates a control signal to finely adjust the first voltage V1 to be equal to the second voltage V2 in an open-loop state and outputs the generated signal to the input corrector. In this case, the output voltage $V_{OUT}$ is represented in consideration of the errors generated in the current sensor so that when the open-loop is changed to the close loop, a value similar to the ideal value may be obtained in accordance with the input current $I_{SEN}$.

FIG. 5 is a flowchart of a method of automatically adjusting an offset voltage of a current sensor according to an embodiment of the present disclosure.

In operation 510, when the input corrector receives a first voltage, a second voltage, and a control signal, in order to reduce an absolute value of a difference between the first voltage and the second voltage based on the control signal, the input corrector corrects at least one of the first voltage and the second voltage and may output a correction result.

In operation 520, the input amplifier may amplify a voltage output from the input corrector.

In operation 530, when the voltage amplified by the input amplifier is input to the output amplifier, the output amplifier may generate an output voltage.

In the meantime, the switch may be grounded while the first signal is applied. Further, the switch may be closed when the second signal is applied. Further, the current sensing value may be determined based on an output voltage acquired after the switch is closed.

Further, the control signal may be determined based on a sign of the difference between the first voltage and the second voltage and when the control signal is changed consecutively two times, the second signal may be applied.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A current sensor configured to automatically adjust an offset voltage, the current sensor comprising:
   an input corrector, upon receiving a first voltage, a second voltage, and a control signal, is configured to adjust either one or both of the first voltage and the second voltage to reduce an absolute value of a difference between the first voltage and the second voltage based on the control signal, and output a correction result;
   an input amplifier configured to amplify a voltage output from the input corrector;
   an output amplifier configured to generate an output voltage when a voltage amplified by the input amplifier is input; and
   a controller, comprising a switch connected to one of voltages amplified by the input amplifier to be grounded when a difference between the first voltage and the second voltage is larger than a first threshold value, and a correction circuit controller configured to generate the control signal to input to the input corrector.

2. The current sensor of claim 1, wherein the switch is grounded while a first signal is applied.

3. The current sensor of claim 2, wherein the switch is closed when a second signal is applied.

4. The current sensor of claim 3, wherein a current sensing value is determined based on the output voltage acquired after the switch is closed.

5. The current sensor of claim 3, wherein when the control signal is consecutively changed, the second signal is applied.

6. The current sensor of claim 1, wherein the control signal is determined based on a sign of the difference between the first voltage and the second voltage.

7. A method of automatically adjusting an offset of a current sensor, comprising:
   receiving a first voltage, a second voltage, and a control signal;
   adjusting, using an input corrector, either one or both of the first voltage and the second voltage to reduce an absolute value of a difference between the first voltage and the second voltage based on the control signal, and outputting a correction result;
   amplifying, using an input amplifier, a voltage output from the input corrector; and
   generating, using output amplifier, an output voltage when the voltage amplified by the input amplifier is input to the output amplifier,
   wherein when a difference between the first voltage and the second voltage is larger than a first threshold value, a switch is grounded and the control signal is generated by a correction circuit controller to be input to the input corrector.

8. The method of claim 7, further comprising grounding the switch when a first signal is applied.

9. The method of claim 8, further comprising closing the switch when a second signal is applied.

10. The method of claim 9, further comprising determining a current sensing value based on the output voltage acquired after the switch is closed.

11. The method of claim 9, wherein when the control signal is consecutively changed, the second signal is applied.

12. The method of claim 7, wherein the control signal is determined based on a sign of the difference between the first voltage and the second voltage.

* * * * *